United States Patent
Sone et al.

(10) Patent No.: US 9,105,845 B2
(45) Date of Patent: Aug. 11, 2015

(54) PIEZOELECTRIC CERAMIC COMPRISING AN OXIDE AND PIEZOELECTRIC DEVICE

(71) Applicant: TDK CORPORATION, Tokyo (JP)

(72) Inventors: Hideaki Sone, Tokyo (JP); Tomohisa Azuma, Tokyo (JP); Masahito Furukawa, Tokyo (JP); Satoko Ueda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 342 days.

(21) Appl. No.: 13/712,426

(22) Filed: Dec. 12, 2012

(65) Prior Publication Data

US 2013/0162108 A1 Jun. 27, 2013

(30) Foreign Application Priority Data

Dec. 26, 2011 (JP) .................................. 2011-283707
Sep. 4, 2012 (JP) .................................. 2012-194120

(51) Int. Cl.
*H01L 41/187* (2006.01)
*C04B 35/495* (2006.01)
*H01L 41/083* (2006.01)

(52) U.S. Cl.
CPC .......... *H01L 41/1873* (2013.01); *C04B 35/495* (2013.01); *H01L 41/083* (2013.01); *C04B 2235/3201* (2013.01); *C04B 2235/3203* (2013.01); *C04B 2235/3213* (2013.01); *C04B 2235/3215* (2013.01); *C04B 2235/3244* (2013.01)

(58) Field of Classification Search
CPC ................................... H01L 41/1873
USPC .......................................... 310/358
See application file for complete search history.

(56) References Cited

U.S. PATENT DOCUMENTS

| 2004/0058797 A1* | 3/2004 | Nonoyama et al. ............ 501/134 |
| 2007/0216264 A1 | 9/2007 | Furukawa et al. |
| 2008/0290316 A1* | 11/2008 | Katayama et al. ..... 252/62.9 PZ |
| 2009/0243439 A1 | 10/2009 | Furukawa et al. |

(Continued)

FOREIGN PATENT DOCUMENTS

| EP | 1 702 906 A1 | 9/2006 |
| EP | 2159205 A1 * | 3/2010 ............ H01L 41/187 |

(Continued)

OTHER PUBLICATIONS

Tanaka D. et al., "Thermal Reliability of Alkaline Niobate-Based Lead-Free Piezoelectric Ceramics," *Japanese Journal of Applied Physics*, 2009, pp. 09KD08-1-09KD08-4, vol. 48.

(Continued)

*Primary Examiner* — Jaydi San Martin
(74) *Attorney, Agent, or Firm* — Oliff PLC

(57) ABSTRACT

A piezoelectric ceramic with environmental friendliness including a composition as the main component composed of a composite oxide free from lead (Pb) as a constituent element, and with excellent piezoelectric characteristics such as the relative dielectric constant, the electromechanical coupling factor, and the piezoelectric constant, and a piezoelectric device using the piezoelectric ceramic, are provided. A piezoelectric ceramic including a composition represented by the following general formula as the main component: $(K_{1-x-y-w-v}Na_xLi_yBa_wSr_v)_m(Nb_{1-z-u}Ta_zZr_u)O_3$ (wherein, x, y, z, w, v, u and m in the formula satisfy the following conditions respectively: $0.4 < x \leq 0.7$; $0.02 \leq y \leq 0.1$; $0 < z \leq 0.3$; $0 < w \leq 0.01$; $0.04 \leq v \leq 0.07$; $0.04 \leq u \leq 0.07$; and $0.95 \leq m < 1$).

6 Claims, 3 Drawing Sheets

(56) References Cited

U.S. PATENT DOCUMENTS

| | | |
|---|---|---|
| 2010/0102679 A1* | 4/2010 | Kawada ............... 310/363 |
| 2011/0156540 A1* | 6/2011 | Hatano et al. ............ 310/366 |
| 2011/0204754 A1* | 8/2011 | Kawada ............... 310/363 |
| 2012/0019108 A1* | 1/2012 | Tanaka et al. ............ 310/366 |
| 2013/0015392 A1* | 1/2013 | Suenaga et al. ........ 252/62.9 PZ |
| 2013/0187516 A1* | 7/2013 | Suenaga et al. ............ 310/360 |

FOREIGN PATENT DOCUMENTS

| | | | | |
|---|---|---|---|---|
| JP | A-S49-125900 | 12/1974 | | |
| JP | B-57-6713 | 2/1982 | | |
| JP | A-2009-242167 | 10/2009 | | |
| JP | 2010269983 A | * 12/2010 | | |
| WO | WO 2008/152851 A1 | 12/2008 | | |
| WO | WO 2010/134604 A1 | 11/2010 | | |
| WO | WO 2010134604 A1 | * 11/2010 | ............ H01L 41/187 |

OTHER PUBLICATIONS

Extended European Search Report issued in European Patent Application No. 12197858.9 on Apr. 11, 2013.

* cited by examiner

PIEZOELECTRIC CERAMIC COMPRISING AN OXIDE AND PIEZOELECTRIC DEVICE

TECHNICAL FIELD

The present invention relates to a piezoelectric ceramic and a piezoelectric device. More specifically, the present invention relates to a lead-free piezoelectric ceramic, a piezoelectric device with a single layer structure using the lead-free piezoelectric ceramic, and a multilayer piezoelectric device such as a multilayer piezoelectric actuator using the lead-free piezoelectric ceramic.

RELATED BACKGROUND ART

Actuators employing piezoelectric ceramics are those using the inverse piezoelectric effect, that when an electric field is applied, mechanical strain and stress are generated. Such actuators possess characteristics, such as generating large stress as well as being capable of gaining very small displacement with high precision. And such actuators are used, for example, in the positioning of precision machine tools or optical devices. In most cases, lead zirconate titanate (PZT), which has excellent piezoelectric properties, is used as the piezoelectric ceramic in the actuators. However, since lead zirconate titanate (PZT) contains a large amount of lead (Pb), the development of lead(Pb)-free piezoelectric ceramics as a substitute for lead zirconate titanate (PZT) have therefore been demanded, and various types of lead-free piezoelectric ceramics have been proposed to meet this demand.

A piezoelectric ceramic made of lithium potassium sodium niobate has been proposed in Patent Documents 1 and 2. The piezoelectric ceramic has a high Curie temperature of 350° C. or more, and also has an excellent electromechanical coupling factor kr.

Also, a piezoelectric material which comprises a compound obtained by replacing a portion of niobium (Nb) in sodium potassium lithium niobate with tantalum (Ta), and a perovskite oxide containing zirconium, alkaline earth metal elements such as strontium (Sr) and the like, have been proposed in Patent Documents 3 and 4. This piezoelectric material is attracting attention because it exhibits a relatively large displacement.

Patent Documents

[Patent Document 1] Japanese Patent Laid-Open No. S49-125900
[Patent Document 2] Japanese Examined Patent Publication No. S57-6713
[Patent Document 3] International Publication No. WO2008/152851
[Patent Document 4] Japanese Patent Laid-Open No. 2009-242167

SUMMARY OF THE INVENTION

However, regarding the aforementioned piezoelectric materials, the sodium potassium lithium niobate is prone to cause abnormal grain growth during sintering. And huge crystal grains of the sodium potassium lithium niobate with particle sizes of several tens of μm (micrometer) or more will be formed, due to slight variations in the composition of the piezoelectric material or in manufacturing conditions. And defects such as voids readily occur in the sintered body, thereby sufficient piezoelectric characteristics cannot be achieved. Moreover, in the case of a laminated body, since particles larger than the ordinary distance between layers (from 10 μm to 100 μm) are formed, the function as a typical piezoelectric body cannot be satisfactorily achieved.

In addition, it is described in Patent Document 4 that at least one kind selected from the group consisting of manganese (Mn) and copper (Cu) is segregated at the grain boundaries of crystal grains of the composition, whereby the piezoelectric characteristics are increased. However, since the number of the grain boundaries of crystal grains where the manganese (Mn) and copper (Cu) are segregated decreases due to the abnormal grain growth, a problem arises that the effect of improving the piezoelectric characteristics cannot be achieved. Moreover, since the number of the grain boundaries of crystal grains decreases due to the abnormal grain growth, a big problem of decrease in mechanical strength also arises.

The present invention has been achieved in light of these circumstances. It is an objective of the present invention to provide a piezoelectric ceramic that is environmentally friendly since it comprises a composition, as the main component, composed of a composite oxide that is free from lead (Pb) as a constituent element, and that has excellent piezoelectric characteristics, such as the relative dielectric constant, the electromechanical coupling factor, and the piezoelectric constant, and to provide a piezoelectric device using the piezoelectric ceramic of the present invention.

To achieve the objectives stated above, the inventors of the present invention have considered it important to suppress the abnormal grain growth in the piezoelectric ceramic in an easy and cheap way, and have made various studies on the compositions in which abnormal grain growth do not occur. As a result, the following invention is accomplished.

That is, a piezoelectric ceramic according to the present invention comprising as the main component a composition represented by the following general formula (1),

$$(K_{1-x-y-w-v}Na_xLi_yBa_wSr_v)_m(Nb_{1-z-u}Ta_zZr_u)O_3 \quad (1)$$

(wherein, x, y, z, w, v, u and m in the formula (1) satisfy the following conditions respectively, $0.4 < x \le 0.7$, $0.02 \le y \le 0.1$, $0 < z \le 0.3$, $0 < w \le 0.01$, $0.04 \le v \le 0.07$, $0.04 \le u \le 0.07$, and $0.95 \le m < 1.0$). Since the value of m in formula (1) which represents the ratio of A-site and B-site in a perovskite structure oxide, is set to less than 1, it is possible to suppress the abnormal grain growth during sintering while obtaining high piezoelectric characteristics.

In addition to the main component described above, the piezoelectric ceramic may comprise at least one kind selected from the group consisting of manganese (Mn) and copper (Cu) as a sub component, the content of which is 1 mass % or less in terms of manganese oxide (MnO) and copper oxide (CuO) respectively, with respect to the composition of the main component. In this way, a stable piezoelectric ceramic with little variation in characteristics can be achieved.

The reason why the piezoelectric ceramic of the present invention exhibits a satisfactorily excellent piezoelectric characteristic is considered to reside in its microstructure. That is, while the piezoelectric ceramic may be prone to abnormal grain growth, the abnormal grain growth can be suppressed in the present invention by controlling the piezoelectric ceramic to a proper composition. Meanwhile, it is considered that a high resistivity of the piezoelectric ceramic can be achieved due to its microstructure wherein at least one element selected from the group consisting of manganese (Mn) and copper (Cu) is segregated at the grain boundaries of crystal grains of the composite oxide as the main component. Presumably, therefore, a sufficiently high polarization voltage can be applied, and a large amount of displacement generated can be achieved.

According to the present invention a piezoelectric device comprising the aforementioned piezoelectric ceramic is also provided.

That is, a piezoelectric device, comprising a piezoelectric ceramic body and electrodes, wherein the electrodes are formed on the surfaces of the piezoelectric ceramic body which is formed of the piezoelectric ceramic according to the present invention.

The piezoelectric device may also be a piezoelectric device comprising a pair of terminal electrodes and a piezoelectric ceramic body that comprises two end faces, wherein the piezoelectric ceramic body is obtained by alternate lamination of internal electrodes and piezoelectric ceramic layers, wherein the pair of terminal electrodes are formed on the two end faces respectively so that the piezoelectric ceramic body is sandwiched, and are electrically connected to the internal electrodes, wherein the piezoelectric ceramic layers are formed of the piezoelectric ceramic according to the present invention.

Since the piezoelectric device according the present invention comprises the piezoelectric ceramic that is lead (Pb)-free and can provide large amount of displacement as described above, it is excellent both in environmental friendliness and in piezoelectric characteristics.

According to the piezoelectric ceramic of the present invention, since the abnormal grain growth does not occur during sintering, the void in the sintered body is suppressed, meanwhile sufficient amount of grain boundaries are provided. Thus, a piezoelectric device with excellent piezoelectric characteristics can be achieved. Since thus obtained piezoelectric device is excellent in piezoelectric characteristics such as the relative dielectric constant, the electromechanical coupling factor, and the piezoelectric constant, it is excellent from the point of view of low pollution, environmental friendliness and ecology.

DETAIL DESCRIPTION OF THE PREFERRED EMBODIMENTS

Figure 1:
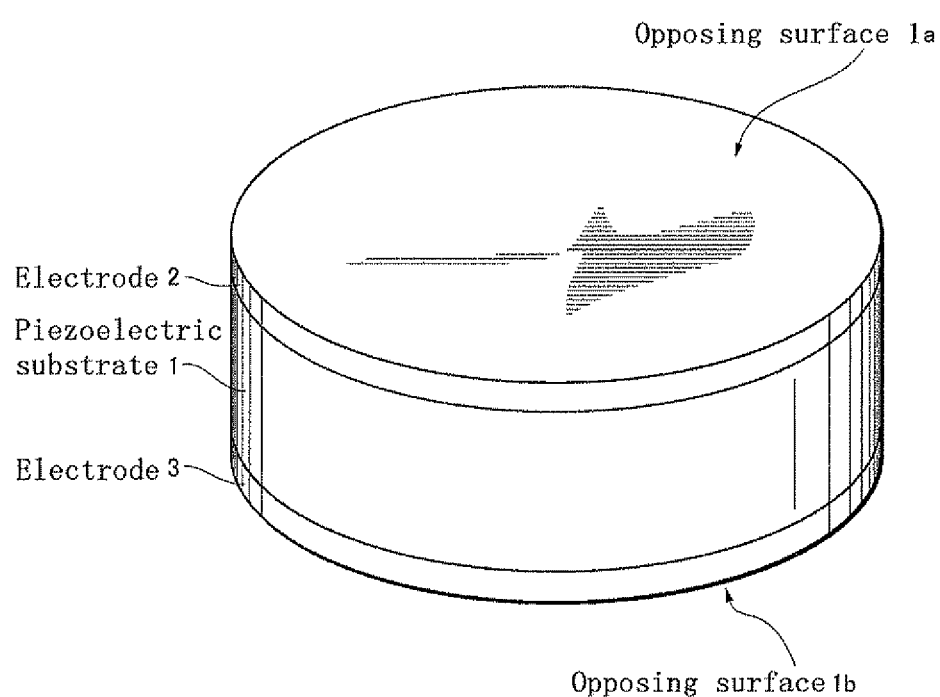
FIG. 1 is a configuration showing a piezoelectric device employing a piezoelectric ceramic according to one embodiment of the present invention.

Hereinafter, preferred embodiments of the present invention will be described in detail with reference to the accompanying drawings where necessary.

The piezoelectric ceramic according to one embodiment of the present invention comprises a composition represented by the following general formula (1) as a main component,

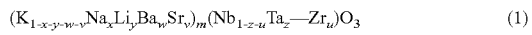

$(K_{1-x-y-w-v}Na_xLi_yBa_wSr_v)_m(Nb_{1-z-u}Ta_z-Zr_u)O_3$  (1)

(wherein, x, y, z, w, v, u and m in the formula (1) are satisfying the following conditions respectively, $0.4<x\leq0.7$, $0.02\leq y\leq0.1$, $0<z\leq0.3$, $0<w\leq0.01$, $0.04\leq v\leq0.07$, $0.04\leq u\leq0.07$, and $0.95\leq m<1.0$).

Since the value of m in the aforementioned formula (1) which represents the ratio of A-site and B-site in the perovskite structure oxide is set to less than 1, it is possible to suppress the abnormal grain growth during sintering while obtaining high piezoelectric characteristics. If m is 1 or greater, the abnormal grain growth tends to occur during sintering. It is more preferable that $m\leq0.975$ is satisfied, whereby the abnormal grain growth can be suppressed more effectively. Furthermore, it is more preferable that $0.95\leq m\leq0.975$ is satisfied. This is because there is a tendency that it becomes difficult to obtain a large relative dielectric constant $\in r$, a large electromechanical coupling factor kr and a large amount of displacement generated, if m is less than 0.95.

In addition, if m is 1 or more, the abnormal grain growth tends to occur, and either of the manganese (Mn) and copper (Cu) added as sub component will diffuse evenly in the grains without being segregated in the grain boundaries. Therefore, excellent piezoelectric characteristics cannot be achieved.

In the above general formula (1), when the value of x, which is the amount of sodium (Na), preferably satisfies $0.45\leq x\leq0.6$, and more preferably satisfies $0.5\leq x\leq0.55$, a piezoelectric ceramic with more excellent piezoelectric characteristics can be achieved. If x exceeds 0.7, the piezoelectric characteristic will decrease. If x is less than 0.4, the amount of potassium will become relatively high, potassium (K) will volatilize violently during sintering, it will be difficult to accomplish sintering, and the abnormal grain growth is prone to occur.

When the value of y, which represents the amount of lithium (Li), preferably satisfies $0.02\leq y\leq0.1$, a piezoelectric ceramic composition with more excellent piezoelectric characteristics can be achieved. If y exceeds 0.1, there is a tendency that the relative dielectric constant $\in r$, electromechanical coupling factor kr and the amount of displacement generated d33 cannot be increased. If y is less than 0.02, high piezoelectric characteristics also cannot be achieved.

The value of w, which represents the amount of barium (Ba), preferably satisfies $0.001\leq w\leq0.008$, and more preferably satisfies $0.003\leq w\leq0.007$, thereby piezoelectric ceramic composition with more excellent piezoelectric characteristics can be achieved. If w is 0 or exceeds 0.01, the electromechanical coupling factor kr and the amount of displacement generated d33 will decrease.

The values of v and u which represent the amounts of strontium (Sr) and zirconium (Zr), respectively, are in the range of from 0.04 to 0.07, and more preferably from 0.04 to 0.06. By satisfying these conditions, the decrease of piezoelectric characteristics due to temperature variation can be suppressed. If v and u exceed 0.07, it will be difficult to accomplish sintering. On the other hand, if v and u are less than 0.04, high piezoelectric characteristics cannot be achieved.

The value of z, which represents the amount of tantalum (Ta), preferably satisfies $0.04\leq z\leq0.2$, and more preferably satisfies $0.05\leq z\leq0.15$, thereby piezoelectric ceramic composition with more excellent piezoelectric characteristics can be achieved. If z exceeds 0.3, the Curie temperature will be low, and the electromechanical coupling factor kr and the amount of displacement generated will become small, If z is 0, high piezoelectric characteristics cannot be achieved.

In addition to the main components mentioned above, the piezoelectric ceramic according to one embodiment may comprise at least one kind selected from the group consisting of manganese (Mn) and copper (Cu) as the sub component, the content of which may be 1 mass % or less in terms of manganese oxide (MnO) and copper oxide (CuO) respectively, with respect to the main component. In this way, the resistance of the piezoelectric ceramic can be increased, and further good piezoelectric characteristics can be achieved. The piezoelectric ceramic according to the embodiment has a microstructure wherein at least one element selected from the group consisting of manganese (Mn) and copper (Cu) is segregated at the grain boundaries of crystal grains of the composite oxide as the main component. Thus, the resistivity of the piezoelectric ceramic can be improved.

The piezoelectric device described so far can be manufactured, for example, by the following process.

First, compound powders including, for example, sodium (Na), potassium (K), lithium (Li), niobium (Nb), tantalum (Ta), strontium (Sr), zirconium (Zr), barium (Ba), and, manganese (Mn) are prepared respectively. These compounds used as starting materials may be oxides or composite oxides, or compounds that form oxides upon heating, such as carbonates or oxalates, of the respective elements. After the starting materials are sufficiently dried, the starting materials are weighed in a proportion such that the final composition is within the above-mentioned ranges.

Then, these materials are mixed in an organic solvent or water using a ball mill or a bead mill and the like.

Then, the mixture is dried and press-molded, or filled into a heat stable vessel such as a ceramic vessel and the like, and calcined at 700-1100° C. for 1-8 hours. The calcine may be carried on once, or may be repeated after the obtained calcined body is pulverized and again press-molded or filled into the heat stable vessel and the like.

After the calcine, for example, the calcined body is pulverized in an organic solvent or water using a ball mill or a bead mill and the like, and dried, by which a piezoelectric ceramic powder is obtained. The piezoelectric ceramic in one embodiment of the present invention can be obtained by sintering the above piezoelectric ceramic powder.

For example, the piezoelectric ceramic powder can be mixed with a binder and granulated, and the granulated powder is press-molded using a uniaxial press molding apparatus, a cold isostatic pressing (CIP) apparatus or the like. After molding, a piezoelectric ceramic is obtained, for example, by heating the press-molded body to remove the binder, and firing it at 950-1350° C. for 2-8 hours.

Generally speaking, it is possible to suppress the abnormal grain growth in a wide range of composition, by controlling the oxygen partial pressure to be lower than air in the firing process. By adjusting the firing process, it is possible to suppress the abnormal grain growth in the piezoelectric ceramic in an easy and cheap way. In the piezoelectric ceramic with a composition described in the present embodiments, the abnormal grain growth does not occur even during firing in general air atmosphere.

Moreover, the piezoelectric ceramic according to one of the present embodiments may comprise lead (Pb) in a small amount as an unavoidable impurity. However, it is necessary to minimize the content of lead (Pb) in view of low pollution, environmental friendliness and ecology, so that the volatilization of lead during firing and the release of lead into the environment upon disposal after distribution as a piezoelectric part on the markets, can be minimized. The piezoelectric ceramic according the present embodiment may be suitably used as a material in piezoelectric devices including vibration elements such as actuators, sound generators, and sensors.

FIG. 1 is an example of a configuration of the piezoelectric device using the piezoelectric ceramic of one embodiment of the present invention. The piezoelectric device comprises a piezoelectric substrate 1 made of the piezoelectric ceramic of one present embodiment, and a pair of electrodes 2,3 provided on a pair of opposing surfaces 1a, 1b of the piezoelectric substrate respectively. The piezoelectric substrate is polarized for example in the direction of thickness, i.e. the direction in which the pair of electrodes 2,3 are facing. And application of a voltage between the electrodes 2,3 will produce longitudinal vibration in the thickness direction and extensional vibration in the radial direction. The electrodes 2,3 are respectively composed of a metal such as silver (Ag), for example. The electrodes 2,3 may also be electrically connected to an external power source via a wire or the like (not shown in the Figures). Such piezoelectric device can be manufactured, for example, by forming the piezoelectric substrate 1 through processing the piezoelectric ceramic according to the present embodiment, providing the electrodes 2,3, and applying an electric field in heated silicone oil to carry out a polarization treatment.

While preferred embodiments of the present invention have been described as above, the present invention is not limited to the above-described embodiments to any extent. For example, while the method of solid state reaction is used as the manufacturing process of the piezoelectric ceramic powder in the above-described embodiments, other manufacturing processes of piezoelectric ceramic powders, for example, hydro-thermal synthesis, sol-gel method or the like may also be used.

EXAMPLES

The present invention will now be illustrated below in more detail based on examples and comparative examples. However, the present invention is not limited to the following examples.

Example 1-3, Comparative Example 1-2

First, sodium carbonate ($Na_2CO_3$) powder, potassium carbonate ($K_2CO_3$) powder, lithium carbonate ($Li_2CO_3$) powder, niobium oxide ($Nb_2O_5$) powder, tantalum oxide ($Ta_2O_5$) powder, barium carbonate ($BaCO_3$) powder, zirconium oxide ($ZrO_2$) powder, strontium carbonate ($SrCO_3$) powder, and manganese carbonate ($MnCO_3$) powder or copper oxide (CuO) powder were prepared as the starting materials of the main component and the sub components. After the starting materials were sufficiently dried, they were weighed so that the composition of the piezoelectric ceramic satisfied the compositions of examples 1-3 and comparative examples 1-2 as shown in Table 1, that is, so that the value of m varied.

The starting materials were mixed in ethanol using a ball mill and sufficiently dried in a thermostatic bath at a temperature of 80-120° C., after which the mixture was press-molded and calcined at the temperature of 750-1050° C. for 1~4 hours. The calcined body was dried again to prepare a piezoelectric ceramic powder after it was pulverized using a ball mill in ethanol.

Next, a binder (acrylic resin) was added to the piezoelectric ceramic powder to granulate the piezoelectric ceramic powder. The granulated powder was molded into a disk-shaped pellet with a diameter of 17 mm through applying a pressure of approximately 25 MPa by using a uniaxial press molding apparatus. After molding, the molded body was heated at 550° C. for 3 hours to remove the binder, then it was fired at 1050-1200° C. for 2 hours. After that, the sintered body was processed into a disk shape with a thickness of 0.6 mm to make the piezoelectric substrate 1, and silver (Ag) was vacuum deposited on both sides of the piezoelectric substrate 1 to form the electrodes 2,3. Then, an electric field of 5 MV/m was applied to the sintered body in silicone oil at 150° C. for 10-30 minutes to carry out polarization, and a piezoelectric device was obtained.

After the obtained piezoelectric device was left for 24 hours, the relative dielectric constant ($\in r$), the electromechanical coupling factor (kr) and the piezoelectric constant d (d33) were measured as the piezoelectric characteristics. In the measurement of ∈r and kr, an impedance analyzer 4294A (produced by Agilent Technologies) was used, and the resonance-antiresonance method was used. And ∈r was measured at a frequency of 1 kHz. In the measurement of d33, a d33 meter ZJ-4B (produced by Institute of Acoustics, Academia Sinica) was used.

(Evaluation Results)

The piezoelectric ceramic compositions of each Example and Comparative Example are shown in Table 1.

Examples 1-3, except that each starting material was weighed so that the values of x, y, z, w, v, u in the general formula $(K_{1-x-y-w-v}Na_xLi_yBa_wSr_v)_m(Nb_{1-z-u}Ta_z—Zr_u)O_3 \ldots (1)$ varied. The results are also shown in Table 1.

As shown in Table 1, in the case where the value of x, which represents the amount of sodium (Na), was in the range of from 0.4 to 0.7, the value of y, which represents the amount of lithium (Li), was in the range of from 0.02 to 0.1, the value of z, which represents the amount of tantalum (Ta), was 0.3 or less, the value of w, which represents the amount of barium (Ba), was 0.01 or less, the value of v, which represents the

TABLE 1

| | x | y | z | w | v | u | m | Mn or Cu | ∈r | kr (%) | d33 (pC/N) | Abnormal grain growth |
|---|---|---|---|---|---|---|---|---|---|---|---|---|
| Example 1 | 0.540 | 0.048 | 0.095 | 0.005 | 0.048 | 0.048 | 0.950 | Mn 0.3 wt % | 1850 | 46.6 | 292 | NO |
| Example 2 | 0.540 | 0.048 | 0.095 | 0.005 | 0.048 | 0.048 | 0.975 | Mn 0.3 wt % | 1794 | 48.6 | 288 | NO |
| Example 3 | 0.540 | 0.048 | 0.095 | 0.005 | 0.048 | 0.048 | 0.995 | Mn 0.3 wt % | 1648 | 46.1 | 278 | NO |
| Example 4 | 0.400 | 0.048 | 0 095 | 0.005 | 0.048 | 0.048 | 0.975 | Mn 0.3 wt % | 1529 | 46.9 | 257 | NO |
| Example 5 | 0.700 | 0.048 | 0.095 | 0.005 | 0.048 | 0.048 | 0.975 | Mn 0.3 wt % | 1927 | 45.3 | 278 | NO |
| Example 6 | 0.540 | 0.020 | 0.095 | 0.005 | 0.048 | 0.048 | 0.975 | Mn 0.3 wt % | 1039 | 46.4 | 251 | NO |
| Example 7 | 0.540 | 0.100 | 0.095 | 0.005 | 0.048 | 0 048 | 0.975 | Mn 0.3 wt % | 2531 | 35.8 | 252 | NO |
| Example 8 | 0.540 | 0.048 | 0.050 | 0.005 | 0.048 | 0.048 | 0.975 | Mn 0.3 wt % | 1638 | 49.2 | 279 | NO |
| Example 9 | 0.540 | 0.048 | 0.300 | 0.005 | 0.048 | 0.048 | 0.975 | Mn 0.3 wt % | 1816 | 42.3 | 253 | NO |
| Example 10 | 0.540 | 0.048 | 0.095 | 0.001 | 0.048 | 0.048 | 0.975 | Mn 0.3 wt % | 1613 | 46.9 | 264 | NO |
| Example 11 | 0.540 | 0.048 | 0.095 | 0.010 | 0.048 | 0.048 | 0.975 | Mn 0.3 wt % | 1678 | 44.3 | 287 | NO |
| Example 12 | 0.540 | 0.048 | 0.095 | 0.005 | 0.040 | 0.048 | 0.975 | Mn 0.3 wt % | 1654 | 46.5 | 265 | NO |
| Example 13 | 0.540 | 0.048 | 0.095 | 0.005 | 0.070 | 0.048 | 0.975 | Mn 0.3 wt % | 1845 | 46.7 | 281 | NO |
| Example 14 | 0.540 | 0.048 | 0.095 | 0.005 | 0.048 | 0.040 | 0.975 | Mn 0.3 wt % | 1679 | 46.4 | 266 | NO |
| Example 15 | 0.540 | 0.048 | 0.095 | 0.005 | 0 048 | 0.070 | 0.975 | Mn 0.3 wt % | 1751 | 46.1 | 270 | NO |
| Example 16 | 0.540 | 0.048 | 0.095 | 0.005 | 0.048 | 0.048 | 0.975 | — | 1747 | 46.3 | 271 | NO |
| Example 17 | 0.540 | 0.048 | 0.095 | 0.005 | 0.048 | 0.048 | 0.975 | Mn 1.0 wt % | 1803 | 45.2 | 269 | NO |
| Example 18 | 0.540 | 0.048 | 0.095 | 0.005 | 0.048 | 0.048 | 0.975 | Mn 1.5 wt % | 1687 | 40.4 | 232 | NO |
| Example 19 | 0.540 | 0.048 | 0.095 | 0.005 | 0.048 | 0.048 | 0.975 | Cu 0.3 wt % | 1699 | 47.7 | 275 | NO |
| Comparative Example 1 | 0.540 | 0.048 | 0.095 | 0.005 | 0.048 | 0.048 | 0.925 | Mn 0.3 wt % | 1511 | 40.2 | 245 | NO |
| Comparative Example 2 | 0.540 | 0.048 | 0.095 | 0.005 | 0.048 | 0.048 | 1.001 | Mn 0.3 wt % | 1399 | 32.9 | 194 | YES |
| Comparative Example 3 | 0.375 | 0.048 | 0.095 | 0.005 | 0.048 | 0.048 | 0.975 | Mn 0.3 wt % | 1132 | 40.2 | 189 | YES |
| Comparative Example 4 | 0.800 | 0.048 | 0.095 | 0.005 | 0.048 | 0.048 | 0.975 | Mn 0.3 wt % | 1209 | 30.2 | 147 | YES |
| Comparative Example 5 | 0.540 | 0.010 | 0.095 | 0.005 | 0.048 | 0.048 | 0.975 | Mn 0.3 wt % | 528 | 40.3 | 129 | NO |
| Comparative Example 6 | 0.540 | 0.200 | 0.095 | 0.005 | 0.048 | 0.048 | 0.975 | Mn 0.3 wt % | — | — | — | NO |
| Comparative Example 7 | 0.540 | 0.048 | 0.000 | 0.005 | 0.048 | 0.048 | 0.975 | Mn 0.3 wt % | 887 | 42.5 | 177 | NO |
| Comparative Example 8 | 0.540 | 0.048 | 0.400 | 0.005 | 0.048 | 0.048 | 0.975 | Mn 0.3 wt % | 1651 | 25.9 | 147 | NO |
| Comparative Example 9 | 0.540 | 0.048 | 0.095 | 0.000 | 0.048 | 0.048 | 0.975 | Mn 0.3 wt % | 892 | 43.3 | 181 | NO |
| Comparative Example 10 | 0.540 | 0.048 | 0.095 | 0.020 | 0.048 | 0.048 | 0.975 | Mn 0.3 wt % | 1420 | 42.1 | 222 | NO |
| Comparative Example 11 | 0.540 | 0.048 | 0.095 | 0.005 | 0.020 | 0.048 | 0.975 | Mn 0.3 wt % | 1400 | 43.4 | 227 | NO |
| Comparative Example 12 | 0.540 | 0.048 | 0.095 | 0.005 | 0.100 | 0.048 | 0.975 | Mn 0.3 wt % | 1563 | 35.7 | 197 | NO |
| Comparative Example 13 | 0.540 | 0.048 | 0.095 | 0.005 | 0.048 | 0.020 | 0.975 | Mn 0.3 wt % | 1383 | 44.4 | 231 | NO |
| Comparative Example 14 | 0.540 | 0.048 | 0.095 | 0.005 | 0.048 | 0.100 | 0.975 | Mn 0.3 wt % | 1642 | 39.3 | 223 | NO |

The composition was analyzed by an ICP-AES Instrument ICPS-8100CL (produced by SHIMADZU CORPORATION) and an X-ray fluorescence spectrometry ZSZ-100e (produced by Rigaku), wherein lithium (Li) was analyzed by ICP-AES and other elements were analyzed by X-ray fluorescence spectrometry.

Figure 2:
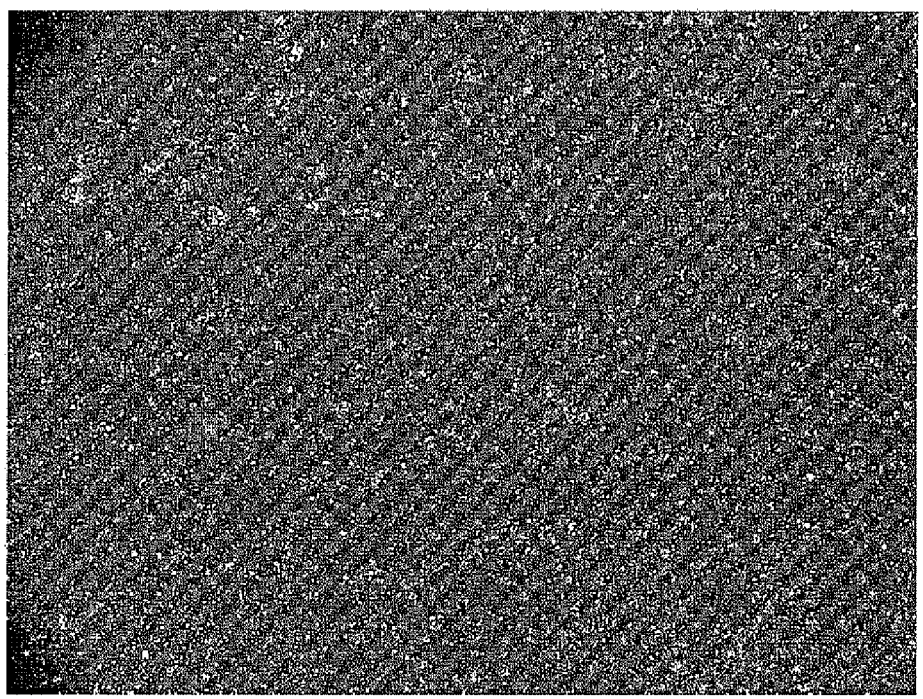
FIG. 2 is a micrograph showing an example of the surface of the sintered body without abnormal grain growth (Example 2).
Figure 3:
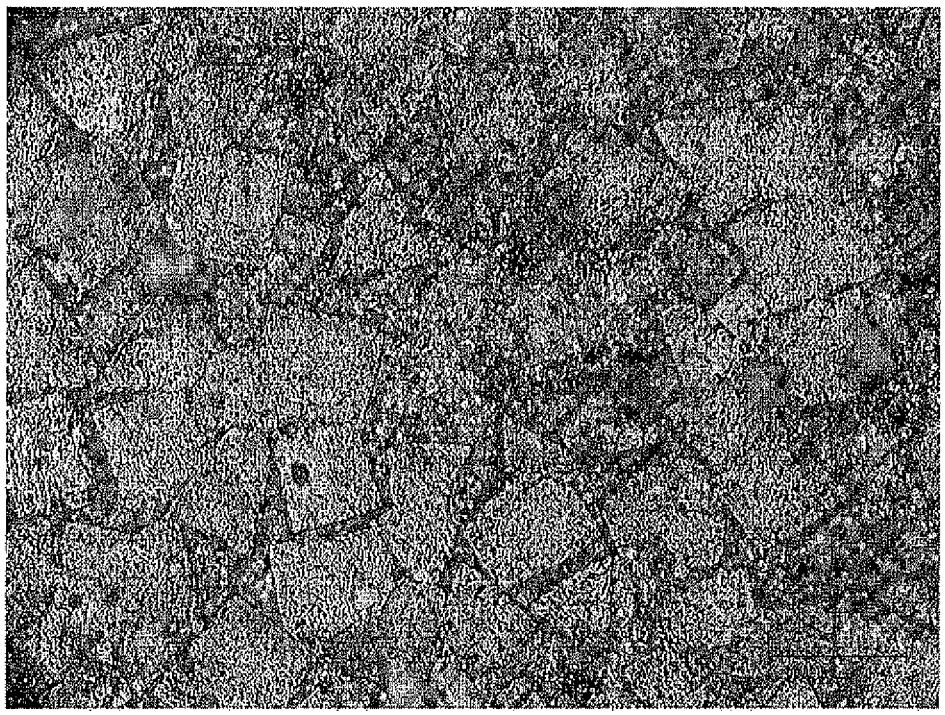
FIG. 3 is a micrograph showing an example of the surface of the sintered body with abnormal grain growth (Comparative Example 2).

The value of m, ∈r, kr, d33 and the presence or absence of abnormal grain growth in Examples 1-3 and Comparative Examples 1-2, are also shown in Table 1. A micrograph of the surface of the sintered body (sample of Example 2) wherein no abnormal grain growth occurred is shown in FIG. 2, while a micrograph of the surface of the sintered body (sample of Comparative Example 2) wherein abnormal grain growth occurred is shown in FIG. 3. According to Table 1, by comparison, any of Examples 1 to 3 wherein m was less than 1 was superior to Comparative Example 2 wherein m was 1 or greater, in that the abnormal grain growth was suppressed and large values of ∈r, kr, d33 were obtained.

Examples 4-15, Comparative Examples 3-14

The samples of Examples 4-15 and Comparative Examples 3-14 were formed and evaluated in the same manner as in amount of strontium (Sr), was in the range of from 0.04 to 0.07, and the value of u, which represents the amount of zirconium (Zr), was in the range of from 0.04 to 0.07, the abnormal grain growth did not occur, and large values of ∈r, kr, d33 were obtained. However, when the values were out of the above ranges as in Comparative Examples 3-14, the values of kr, d33 decreased.

Examples 16-19

Samples of Examples 16-18 were formed and evaluated in the same manner as in Examples 1-3, except that the starting materials were weighed so that the amount of manganese oxide (MnO) as the additive varied. The results are also shown in Table 1. Further, in Example 19, copper oxide (CuO) was weighed and added as the substitute of manganese oxide (MnO), and a sample was formed and evaluated in the same manner as in Examples 1-3. The results are also shown in Table 1.

Even in the case in which manganese oxide (MnO) was not added as shown in Example 16, abnormal grain growth was not observed and ∈r, kr, d33 showed large values, as long as other composition fell into a predetermined range. In addition, even in the case in which the added amount of manganese oxide (MnO) was 1.0 wt %, abnormal grain growth was not observed and large values of ∈r, kr, d33 were obtained. However, if the added amount of manganese oxide (MnO) reached 1.5 mass % which exceeded 1.0 mass %, although the abnormal grain growth did not occur, d33 decreased slightly. Moreover, as shown in Example 18, in the case in which copper oxide (CuO) was added instead of manganese oxide (MnO), the same effect as that obtained in the case of adding manganese oxide (MnO) was obtained.

As shown in Table 1, large values of both kr and d33 were obtained, and the abnormal grain growth did not occur, as long as the compositions fell within the scope of the compositions described in the Claims. On the other hand, if the composition were outside the scope as described in the Claims, low values of both kr and d33 were obtained.

Although the present invention has been described by way of illustrating embodiments and examples as the above, the present invention is not intended to be limited to the embodiments and examples, and the present invention may be varied in various manners. In addition, although the piezoelectric device of a single plate structure was illustrated as an example in the above embodiments, the present invention may also be applied to other piezoelectric devices of a multi layer structure and the like. Further, although examples of oscillating devices including actuators, sound generators, sensors and the like were illustrated, the present invention may also be applied to other piezoelectric devices.

The present invention can be applied in piezoelectric devices such as oscillating devices including actuators, sound generators, sensors and the like.

DESCRIPTION OF REFERENCE NUMERALS

1 . . . Piezoelectric substrate
1a,1b . . . Opposing surfaces
2,3 . . . Electrodes

What is claimed is:

1. A piezoelectric ceramic comprising a composition represented by the following general formula (1) as the main component,

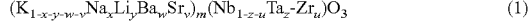

$$(K_{1-x-y-w-v}Na_xLi_yBa_wSr_v)_m(Nb_{1-z-u}Ta_z-Zr_u)O_3 \quad (1)$$

wherein, x, y, z, w, v, u and m in the formula (1) are satisfying the following conditions respectively, $0.4 < x \leq 0.7$, $0.02 \leq y \leq 0.1$, $0 < z \leq 0.3$, $0 < w \leq 0.01$, $0.04 \leq v \leq 0.07$, $0.04 \leq u \leq 0.07$, and $0.95 \leq 0.975$.

2. A piezoelectric ceramic according to claim 1, further comprising at least one component selected from the group consisting of manganese (Mn) and copper (Cu) as a sub component of the piezoelectric ceramic, the content of which is 1 mass % or less in terms of manganese oxide (MnO) and copper oxide (CuO) respectively, with respect to the main component.

3. A piezoelectric device, comprising a piezoelectric ceramic body and electrodes, wherein the electrodes are formed on the surfaces of the piezoelectric ceramic body which is formed of the piezoelectric ceramic according to claim 1.

4. A piezoelectric device comprising a pair of terminal electrodes and a piezoelectric ceramic body that comprises two end faces,
wherein the piezoelectric ceramic body is obtained by alternate lamination of internal electrodes and piezoelectric ceramic layers,
wherein the pair of terminal electrodes are formed on the two end faces respectively so that the piezoelectric ceramic body is sandwiched, and are electrically connected to the internal electrodes,
wherein the piezoelectric ceramic layers are formed of the piezoelectric ceramic according to claim 1.

5. A piezoelectric device, comprising a piezoelectric ceramic body and electrodes, wherein the electrodes are formed on the surfaces of the piezoelectric ceramic body which is formed of the piezoelectric ceramic according to claim 2.

6. A piezoelectric device comprising a pair of terminal electrodes and a piezoelectric ceramic body that comprises two end faces,
wherein the piezoelectric ceramic body is obtained by alternate lamination of internal electrodes and piezoelectric ceramic layers,
wherein the pair of terminal electrodes are formed on the two end faces respectively so that the piezoelectric ceramic body is sandwiched, and are electrically connected to the internal electrodes,
wherein the piezoelectric ceramic layers are formed of the piezoelectric ceramic according to claim 2.

* * * * *